(12) United States Patent
Kim

(10) Patent No.: US 8,258,558 B2
(45) Date of Patent: Sep. 4, 2012

(54) IMAGE SENSOR AND METHOD OF MANUFACTURING THE SAME

(75) Inventor: Tae Gyu Kim, Gyeongsangnam-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 151 days.

(21) Appl. No.: 12/553,638

(22) Filed: Sep. 3, 2009

(65) Prior Publication Data

US 2010/0059846 A1    Mar. 11, 2010

(30) Foreign Application Priority Data

Sep. 11, 2008  (KR) .................. 10-2008-0089690

(51) Int. Cl.
*H01L 31/062* (2012.01)
*H01L 31/113* (2006.01)

(52) U.S. Cl. ........ 257/292; 257/291; 257/293; 257/294; 257/E27.133

(58) Field of Classification Search .................. 257/292, 257/E27.133

See application file for complete search history.

(56) References Cited

U.S. PATENT DOCUMENTS

| 6,841,411 B1 * | 1/2005 | Varghese | 438/94 |
| 2009/0065828 A1 * | 3/2009 | Hwang | 257/292 |
| 2010/0025801 A1 * | 2/2010 | Han | 257/461 |

FOREIGN PATENT DOCUMENTS

| KR | 10-2005-0117674 A | 12/2005 |
| KR | 10-2006-0120260 A | 11/2006 |

OTHER PUBLICATIONS

Notice of Allowance dated Dec. 27, 2010 in Korean Application No. 10-2008-0089690, filed Sep. 11, 2009.

* cited by examiner

*Primary Examiner* — Cuong Q Nguyen
*Assistant Examiner* — Hsin-Yi Hsieh
(74) *Attorney, Agent, or Firm* — Saliwanchik, Lloyd & Eisenschenk

(57) ABSTRACT

Provided are image sensors and methods of manufacturing the same. An image sensor includes a metal line and an interlayer insulation layer on a semiconductor substrate including a readout circuit; an image detection unit on the interlayer insulation layer and including stacked first and second doping layers; a pixel separation unit penetrating the image detection unit, separating the image detection unit by pixel; a first metal contact penetrating the image detection unit and the interlayer insulation layer to contact the metal line; a first barrier pattern protecting the first metal contact from contacting the second doping layer, while exposing the first metal contact to the first doping layer; and a second metal contact in a trench above the first metal contact, wherein the second metal contact is electrically connected to the second doping layer while being isolated from the first metal contact by a second barrier pattern.

9 Claims, 11 Drawing Sheets

US 8,258,558 B2

IMAGE SENSOR AND METHOD OF MANUFACTURING THE SAME

CROSS-REFERENCE TO RELATED APPLICATION

This application claims the benefit under 35 U.S.C. §119 to Korean Patent Application No. 10-2008-0089690, filed Sep. 11, 2008, which is hereby incorporated by reference in its entirety.

BACKGROUND

The present disclosure relates to an image sensor.

An image sensor is a semiconductor device that converts an optical image into an electrical signal, and is largely classified into a charge coupled device (CCD) image sensor and a complementary metal oxide semiconductor (CMOS) image sensor (CIS).

The CIS includes a photodiode region for receiving and converting a light signal into an electrical signal and a transistor region for processing the electrical signal, where the photodiode and the transistor region are placed horizontally.

In relation to the horizontal image sensor, the photodiode region and the transistor region are horizontally disposed on a semiconductor substrate so that there exists a limitation in expanding a light detecting portion in a limited area (this is typically referred to as a "Fill Factor").

In order to overcome this limitation, as one approach, a photodiode is deposited using amorphous silicon (Si) above circuitry formed on a Si substrate. As another approach, circuitry is formed on a Si substrate and a photodiode is formed on a separate substrate and disposed on the Si substrate using a wafer-to-wafer bonding method. The photodiode is provided on and connected to a readout circuit of the circuitry. This configuration is referred to as a three-dimensional (3-D) image sensor. The photodiode and the circuitry are connected through a metal line.

However, in relation to the wafer-to-wafer bonding method, because the bonding surface of a wafer may not be even, its bonding strength may be deteriorated. The unevenness is often due to a metal line for connecting the photodiode with the circuitry being exposed to the surface of an interlayer insulation layer. Therefore, the interlayer insulation layer may have an uneven surface profile. As a result, the interlayer insulation layer may have less bonding power with respect to the photodiode formed thereon.

BRIEF SUMMARY

Embodiments provide an image sensor that employs a vertical integration of a readout circuit and a photodiode and has stacked signal delivery and ground electrode metal lines at a same region to obtain a light receiving region of an image detection unit and a method of manufacturing the image sensor. In accordance with an embodiment, the fill-factor can be improved.

In one embodiment, an image sensor includes: a metal line and an interlayer insulation layer formed on a semiconductor substrate including a readout circuit; an image detection unit formed on the interlayer insulation layer and including stacked first and second doping layers; a pixel separation unit penetrating the image detection unit to allow the image detection unit to be separated by each pixel; a first metal contact penetrating the image detection unit and the interlayer insulation layer, the first metal contact being adjacent to the pixel separation unit and electrically connected to the metal line; a first barrier pattern formed on an upper sidewall of the first metal contact to cover the second doping layer and expose the first doping layer; a second barrier pattern formed on the first metal contact in a recess unit formed by removing a portion of the first metal contact to expose the first barrier pattern at a region corresponding to the second doping layer; and a second metal contact formed in a trench that is formed on the second barrier pattern and exposes the second doping layer, the second metal contact being electrically connected to the second doping layer.

In another embodiment, an method of manufacturing an image sensor includes: forming a metal line and an interlayer insulation layer on a semiconductor substrate including a readout circuit; forming an image detection unit with stacked first and second doping layers on the interlayer insulation layer; forming a pixel separation unit that penetrates the image detection unit to separate the image detection unit by each pixel; forming a via hole that penetrates the image detection unit and the interlayer insulation layer, the via hole being adjacent to the pixel separation unit and exposing the metal line; forming a first barrier pattern at a sidewall of the via hole to cover the second doping layer and expose the first doping layer; forming a first metal contact in the via hole to be connected to the metal line; forming a second barrier pattern on the first metal contact in the via hole; forming a trench on the second barrier pattern to expose the second doping layer; and forming a second metal contact in the trench to be electrically connected to the second doping layer.

The details of one or more embodiments are set forth in the accompanying drawings and the description below. Other features will be apparent from the description and drawings, and from the claims.

DETAILED DESCRIPTION

An image sensor and a method of manufacturing the same according to embodiments will be described in more detail with reference to the accompanying drawings.

<First Embodiment>

Figure 1:
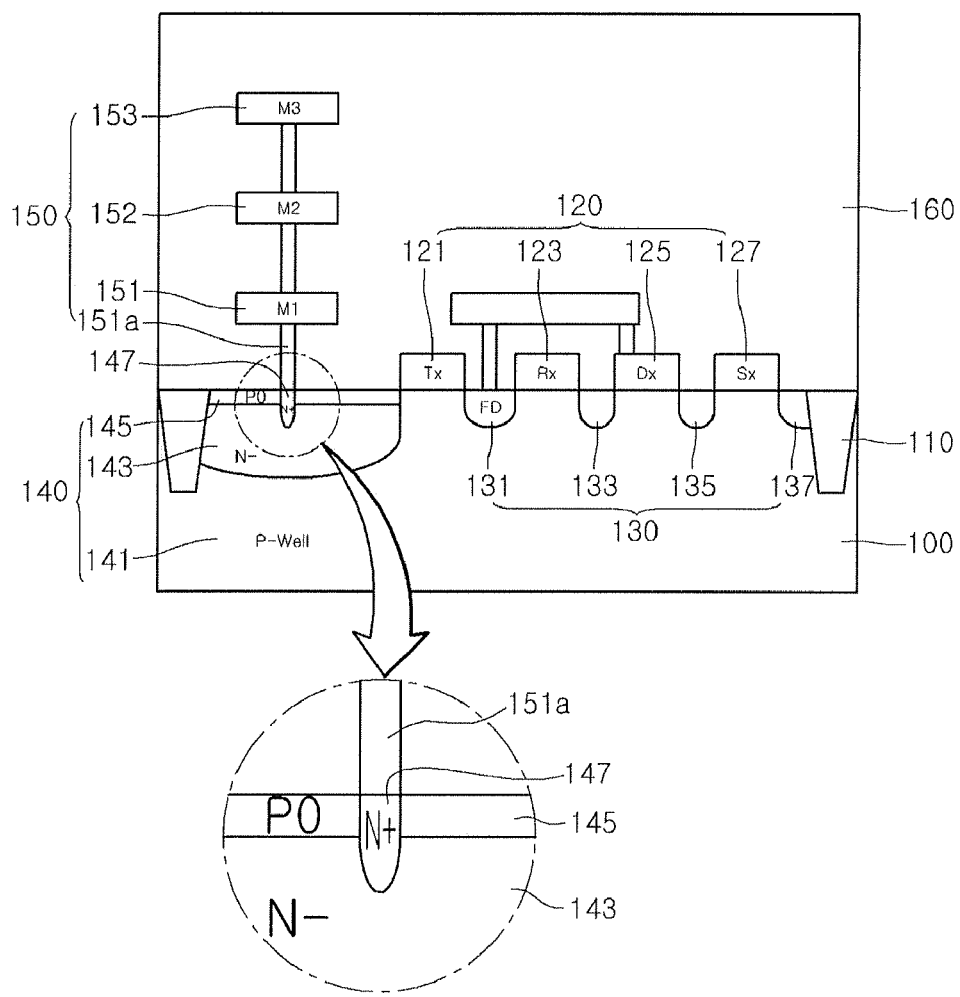
FIGS. 1 to 13 are views illustrating manufacturing processes of an image sensor according to a first embodiment.
Figure 3:
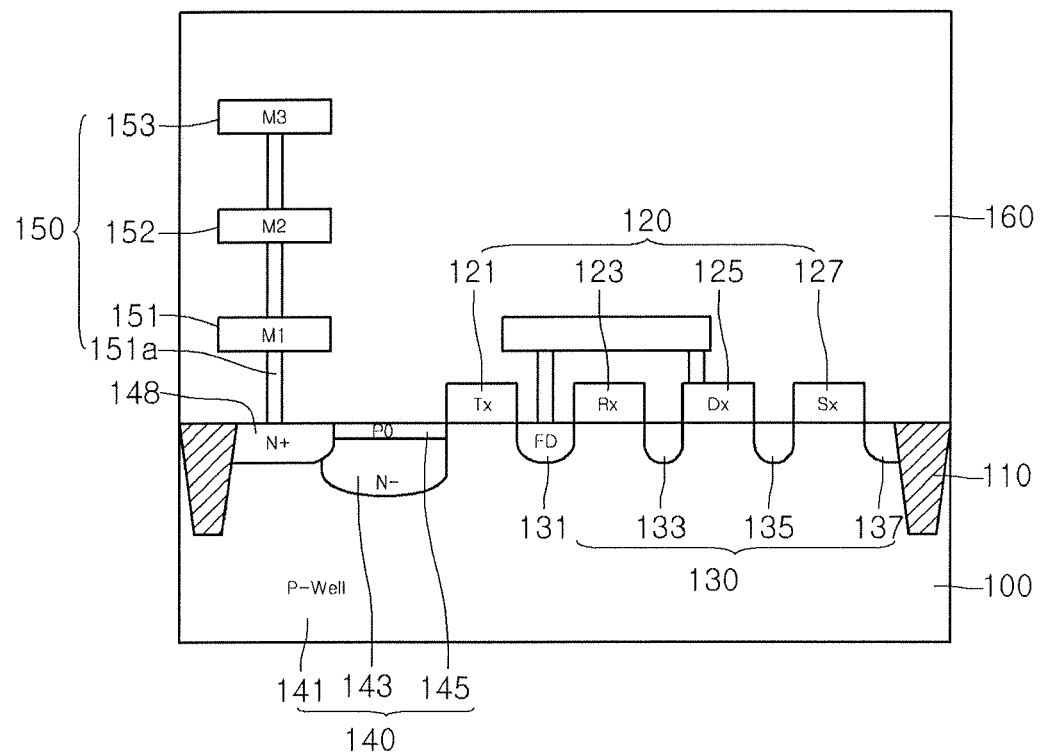
Figure 11:
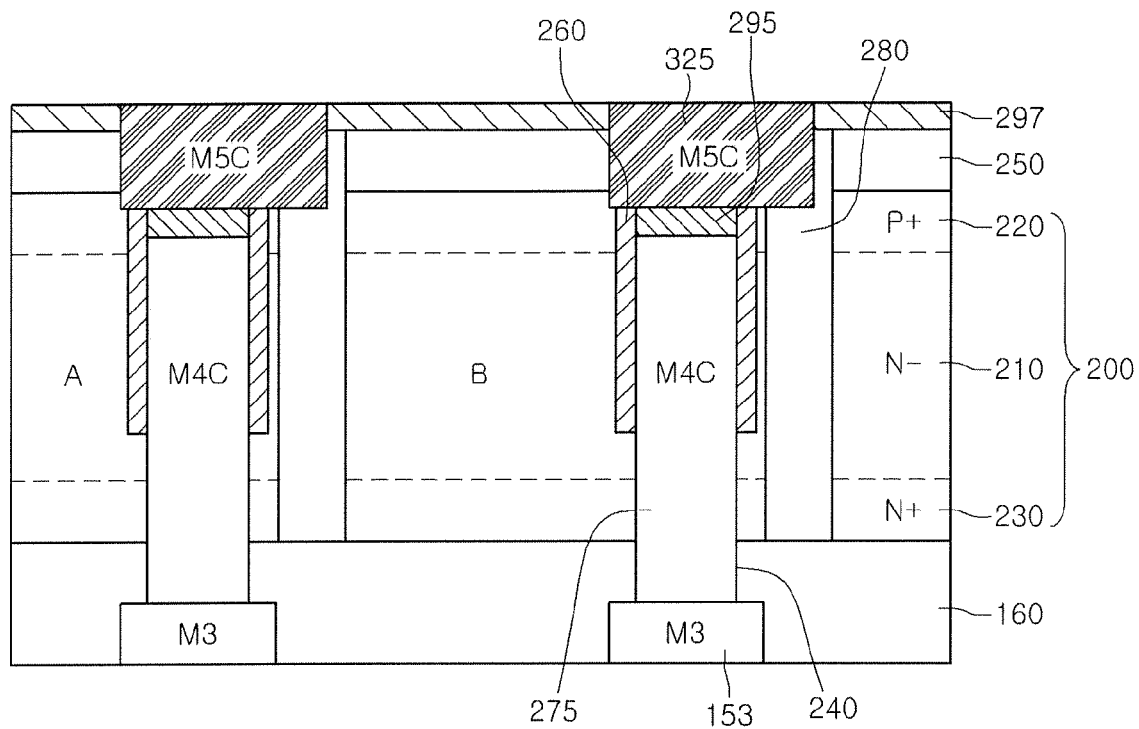

FIG. 11 is a cross-sectional view illustrating an image sensor according to an embodiment and FIGS. 1 and 3 are detailed views of the substrate below the image detection unit of FIG. 11 in accordance with certain embodiments.

Referring to FIGS. 1, 3 and 11, an image sensor according to an embodiment includes a metal line 150 and an interlayer insulation layer 160, an image detection unit 200, a pixel separation unit 280, a fourth metal contact 275, a first barrier pattern 260, a second barrier pattern 295, and a fifth metal contact 325. The metal line 150 and an interlayer insulation layer 160 are formed on a semiconductor substrate 100 including a readout circuit 120. The image detection unit 200 has stacked first and second doping layers 210 and 220 disposed on the interlayer insulation layer 160. The pixel separation unit 280 penetrates the image detection unit 200 so as to separate the image detection unit 200 into a plurality of pixels. The fourth metal contact 275 penetrates the image detection unit 200 and the interlayer insulation layer 160 in a region adjacent to the pixel separation unit 280 so as to be connected to the metal line 150. The first barrier pattern 260 is formed on the upper sidewall of the fourth metal contact 275 so as to cover the second doping layer 220 and partially expose the first doping layer 210. The second barrier pattern 295 is formed on the fourth metal contact 275 in a recess unit (see reference 245 of FIG. 8). The recess unit 245 can be formed by removing a portion of the fourth metal contact 275 so as to expose the first barrier pattern 260 at a region corresponding to the second doping layer 220. The fifth metal contact 325 is formed in a trench 300 so as to be electrically connected to the second doping layer 220. The trench 300 can be formed on the second barrier pattern 295 so as to expose the second doping layer 220.

The first doping layer 210 of the image detection unit 200 is electrically connected to the fourth metal contact 275. The fourth metal contact 275 is separated and electrically isolated from the second doping layer 220 by the first barrier pattern 260 and the second barrier pattern 295. Accordingly, photoelectrons generated in the image detection unit 200 may be delivered to the readout circuit 120 through the metal line 150. Additionally, the second doping layer 220 of the image detection unit 200 is electrically connected to the fifth metal contact 325, such that a ground voltage can be applied to only the second doping layer 220.

Because the second barrier pattern 295 is disposed on the fourth metal contact 275 and the fifth metal contact 325 is stacked on the second barrier pattern 295, the area of a light receiving region of the image detection unit 200 can be obtained to the maximum.

Figure 12:
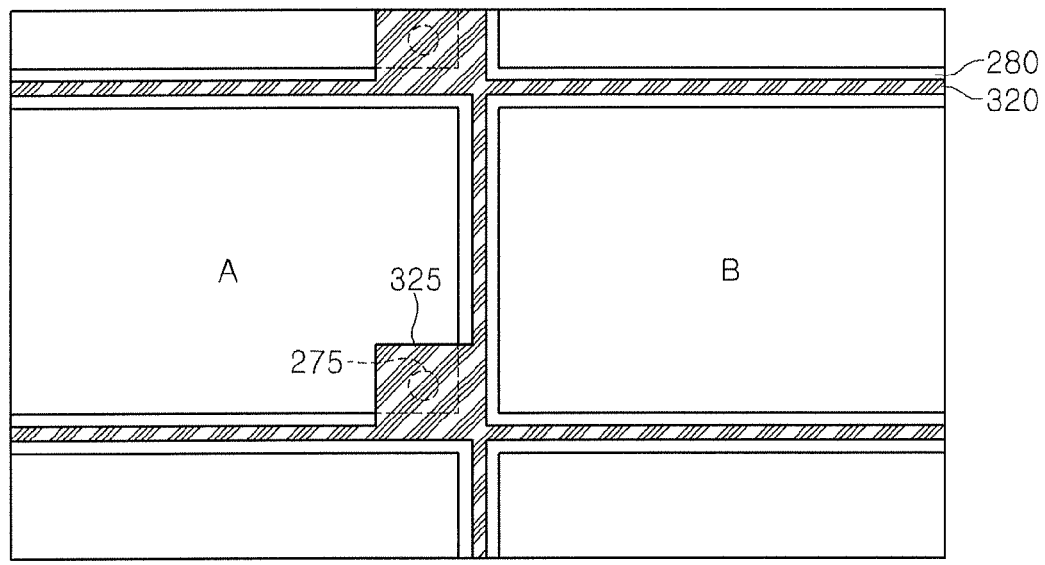

As shown in the plan view illustrated in FIG. 12, the pixel separation unit 280 is formed with a mesh type layout, and the fifth metal contact line 320 connected to the fifth metal contact 325 is formed within the pixel separation unit 280, such that device integration can be obtained.

Unexplained drawing numbers of FIG. 11 will be described below with respect to a method of manufacturing an image sensing device.

Hereinafter, a method of manufacturing an image sensor will be described with reference to FIGS. 1 to 13.

Referring to FIG. 1, a metal line 150 and interlayer insulation layer 160 can be formed on the semiconductor substrate 100 including a readout circuit 120.

The semiconductor substrate 100 may be a single crystal or poly crystal silicon substrate, or may be doped with a p-type impurity or an n-type impurity. A device isolation layer 110 is formed in the semiconductor substrate 100 to define an active region. The readout circuit 120 including a transistor in each unit pixel is formed on the active region.

The readout circuit 120 may include a transfer transistor (Tx) 121, a reset transistor (Rx) 123, a drive transistor (Dx) 125, and a select transistor (Sx) 127. An ion implantation region 130, including a floating diffusion region (FD) 131 and source/drain regions 133, 135, and 137 with respect to each transistor can be formed. Although the readout circuit is described as a four transistor (4 Tr) type circuit, the readout circuit 120 may be other configurations such as 3 Tr or 5 Tr circuits.

The forming of the readout circuit 120 on the semiconductor substrate 100 includes forming an electrical junction region 140 on the semiconductor substrate 100 and forming a first conductive connection region 147 on the electrical junction region 140 to be connected to the metal line 150.

For example, the electrical junction region 140 may be a PN junction, but is not limited thereto. For example, the electrical junction region 140 may include a first conductive type ion implantation layer 143 formed on a second conductive type well 141 (or a second conductive type epi layer), and a second conductive type ion implantation layer 145 formed on the first conductive type ion implantation layer 143. For example, the PN junction 140 may be a P0(145)/N−(143)/P-well(141) junction as shown in FIG. 1, but embodiments are not limited thereto. Additionally, the semiconductor substrate 100 may be formed of the second conductive type, but embodiments are not limited thereto.

According to embodiments of the present invention, a device is designed to have a potential difference between a source and drain of the transfer transistor Tx in order to provide full dumping of photo charge. Accordingly, the photo charge generated in the photodiode is dumped into the floating diffusion region, and thus output image sensitivity can be improved.

That is, a voltage difference exists between the source and the drain of the transfer transistor Tx 121 by forming the electrical junction region 140 on the semiconductor substrate 100 at the source of the transfer transistor Tx 121 of the readout circuit 120. Therefore, it is possible for full dumping of photo charge.

Figure 2:
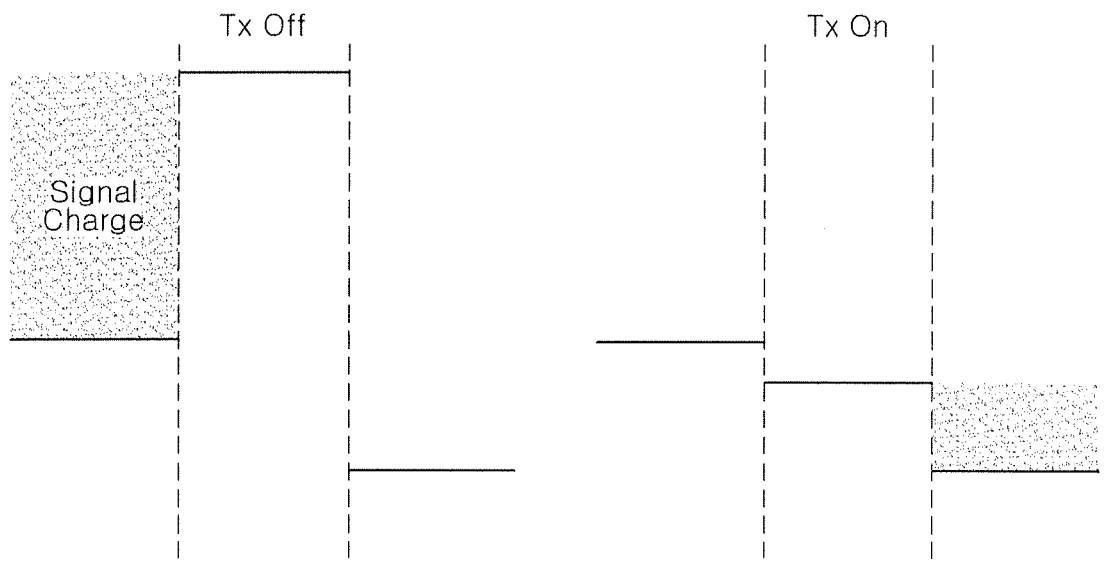

Hereinafter, a dumping structure of a photo charge will be described with reference to FIGS. 1 and 2.

In embodiments, unlike a node of the floating diffusion region FD 131 (that is, an N+ junction), a P0/N−/P-well junction 140 (that is, the electrical junction region 140) does not receive an applied voltage completely and is pinched-off at a constant voltage. This voltage is called a pinning voltage, which is dependent on the doping concentration of the P0 region 145 and the N− region 143.

In more detail, electrons generated in the photodiode are transferred into the P0/N−/P-well junction 140, and then into the node of the floating diffusion region FD 131 to be converted into a voltage when the transfer transistor Tx 121 is turned on.

The maximum voltage value of the P0/N−/P-well junction 140 becomes a pinning voltage and the maximum voltage value of the node of the floating diffusion region FD 131 becomes Vdd minus the threshold voltage Vth of the reset transistor Rx. Therefore, as shown in FIG. 2, due to a potential difference between both sides of the Tx 121, electrons generated in a photodiode of a chip can be completely dumped into the node of the floating diffusion region FD 131 without charge sharing.

That is, the reason for forming of a P0/N−/P-well junction instead of an N+/Pwell junction on a silicon (Si)-sub (that is, the semiconductor substrate 100) is that pinch-off occurs in a P0/N−/Pwell Double Junction at over a constant voltage like a BJT structure since a positive (+) voltage is applied to the N− region 143 and a ground voltage is applied to the Pwell 141 in the P0/N−/Pwell junction during a 4-Tr active pixel sensor (APS) reset operation. Accordingly, a voltage difference occurs between the source and the drain at sides of the transfer transistor Tx 121, such that photo charge is fully dumped into a floating diffusion region FD through the transfer transistor TX from the N-well during the transfer transistor Tx's On/Off operation. As a result, charge sharing phenomenon can be inhibited from occurring.

Accordingly, unlike a related art where a photodiode is connected to an N+ junction, according to embodiments, the deterioration of saturation and sensitivity can be inhibited.

Referring again to FIG. 1, a first conductive connection region 147 is formed between the photodiode and the readout circuit 120 so as to form a smooth passage of a photo charge. Therefore, a dark current source can be minimized and also the deterioration of saturation and sensitivity can be inhibited.

For this, according to certain embodiments, an N+ doped region may be formed on the surface of the P0/N−/P-well junction 140 as the first conductive connection region 147. The N+ region 147 may be formed to penetrate the P0 region 145 and contact the N− region 143.

In addition, the width of the first conductive connection region 147 can be minimized in order to minimize the possibility that first conductive connection region 147 becomes a leakage source.

For this, according to embodiments, a plug implant may proceed after etching of a via hole for the second metal contact 151a, but embodiments are not limited thereto. For example, an ion implantation pattern (not shown) can be formed exposing a portion (such as a contact formation portion) of the electrical junction 140, and the first conductive connection region 147 may be formed by using the ion implantation pattern as an ion implantation mask.

That is, a reason that N+ is locally doped into a contact formation portion is that a dark signal is minimized and an ohmic contact is formed. If N+ is doped into an entire portion of a source of the transfer transistor Tx 121, such as in a related art technique, a dark signal may be increased by a Si surface dangling bond.

FIG. 3 is a view illustrating another structure of a readout circuit. As shown in FIG. 3, a first conductive connection region 148 may be formed at one side of the P0/N−/P-well junction region 140.

Referring to FIG. 3, the N+ connection region 148 for ohmic contact may be formed at the P0/N−/P-well junction 140. At this point, a formation process for the N+ connection region 148 and a contact 151a may be a leakage source. The reason is that an electric field may occur at the Si surface because it operates while reverse bias is applied to the P0/N−/P-well junction 140. This crystal defect caused by an electric field during a contact formation process becomes a leakage source.

Additionally, when the N+ connection region 148 is formed on the surface of the P0/N−/P− junction 140, an electric field occurs additionally because of the N+ (148)/P0 (145) junction. Therefore, this also may become a leakage source.

Accordingly, a layout is provided as shown in FIG. 3, in which an n+ connection region 148 is formed in a region of the semiconductor substrate 100 that is not doped with a P0 layer at its surface; a first contact plug 151a is formed on the N+ connection region 148; and the first contact plug 151a is electrically connected to the N− region 143 through the n+ connection region 148.

Then, an electric field does not occur on the surface of the semiconductor substrate 100 and this contributes to the reduction of a dark current in a 3-D image sensor.

Referring to FIGS. 1 and 3, an interlayer insulation layer 160 and metal line 150 may be formed on the semiconductor substrate 100. The metal line 150 may include the first metal contact 151a, a first metal 151, a second metal 152, and a third metal 153, but embodiments are not limited thereto. In certain embodiments, after the forming of the third metal 153, an insulation layer is deposited to cover the third metal 153 and then a planarization operation is performed to complete formation of the interlayer insulation layer 160, while not exposing the third metal 153. Accordingly, the surface of the interlayer insulation layer 160 having a uniform surface profile may be exposed above the semiconductor substrate 100.

Figure 4:
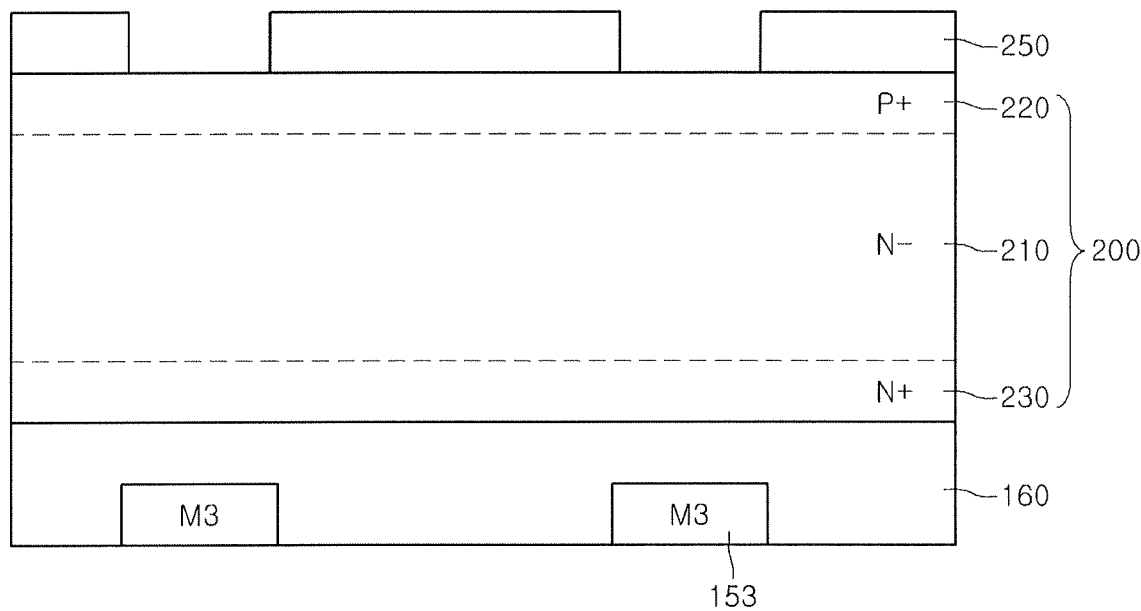

Referring to FIG. 4, an image detection unit 200 is formed on the interlayer insulation layer 160 of the semiconductor substrate 100. The image detection unit 200 is formed of a first doping layer (N−) 210 and a second doping layer (P+) 220 and thus has a photodiode structure of a PN junction. Additionally, an ohmic contact layer (N+) 230 may be formed at the bottom of the first doping layer 210.

For reference, the third metal M3 153 and the interlayer insulation layer 160 of FIG. 4 represent a portion of the metal line 150 and the interlayer insulation layer 160 of FIG. 1 (or FIG. 3). For convenience of description, the readout circuit 120 and the metal line 150 are omitted.

According to an embodiment, in order to form the image detection unit 200, an N-type impurity N− and a P-type impurity P+ are sequentially ion-implanted in a P-type carrier substrate (not shown) of a crystal structure, such that the image detection unit 200 may have a structure where the first doping layer 210 and the second doping layer 220 are stacked. Additionally, an N-type impurity N+ of a high concentration is ion-implanted at one side of the first doping layer 210 to form an ohmic contact layer 230. The ohmic contact layer 230 may lower a contact resistance between the image detection unit 200 and the metal line 150.

In embodiments, the first doping layer 210 may be formed with a broader area (e.g., greater thickness) than the second doping layer 220. Thus, a depletion area is expanded to increase the generation of photoelectrons.

Next, the ohmic contact layer 230 of the carrier substrate (not shown) is positioned on the interlayer insulation layer 160, and then a bonding process is performed to combine the semiconductor substrate 100 with the carrier substrate. Then, the carrier substrate having a hydrogen layer (not shown) is removed using a cleaving process to expose the image detection unit 200 bonded on the interlayer insulation layer 160. Thus, the surface of the second doping layer 220 is exposed.

Accordingly, the image detection unit 200 is formed on the readout circuit 120 to increase the fill factor and reduce the defects of the image detection unit 200. Additionally, since the image detection unit 200 is bonded on the interlayer insulation layer 160 having a uniform surface profile, physical bonding can be improved.

Next, a hard mask 250 is formed on the image detection unit 200. The hard mask 250 is formed exposing the surface of the image detection unit 200 at regions corresponding to the third metal 153. In an embodiment, the hard mask 250 may be formed of an oxide layer or a nitride layer.

Figure 5:
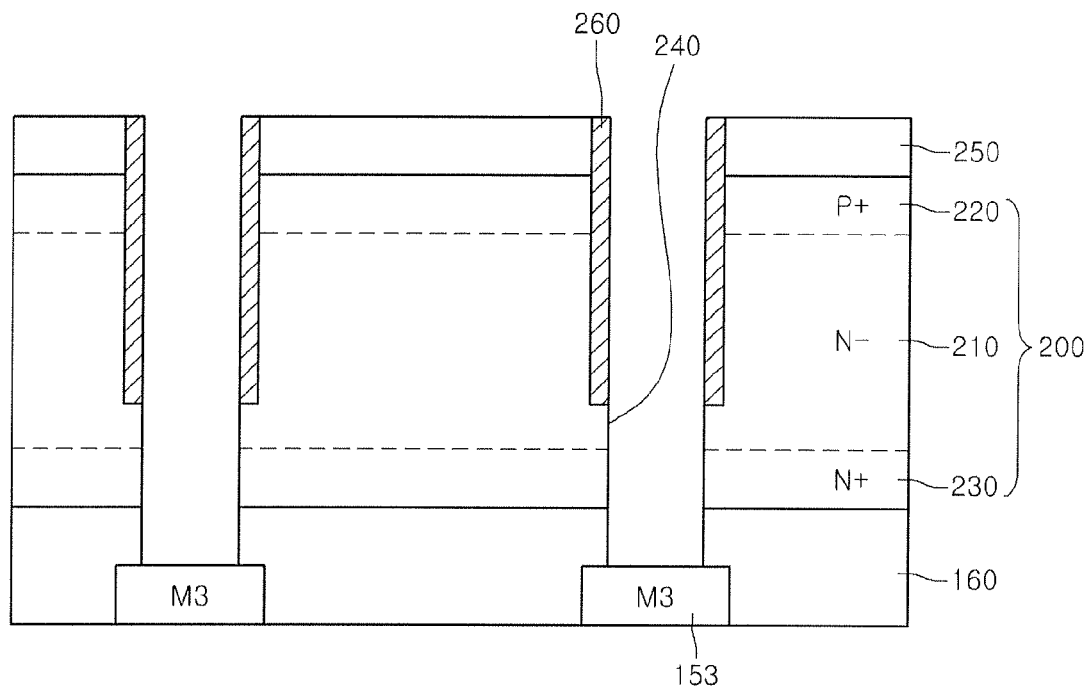

Referring to FIG. 5, a via hole 240 is formed to penetrate the image detection unit 200 and the interlayer insulation layer 160. The via hole 240 is a deep via hole and exposes the surface of the third metal 153.

A first barrier pattern 260 is formed on a portion of the first doping layer 210 and the sidewall of the via hole 240 of the image detection unit 200 corresponding to the second doping layer 220. For example, the first barrier pattern 260 may be formed of an oxide layer or a nitride layer.

The second doping layer 220 at the sidewall of the first via hole 240 is completely covered by the first barrier pattern 260, and the first doping layer 210 adjacent to the second doping layer 220 is partially covered. Accordingly, a portion of the first doping layer 210 and the ohmic contact layer 230 are exposed by the first via hole 240. Moreover, the first barrier pattern 260 may be formed at the sidewall of the first via hole 240 to cover all the first and second doping layers 210 and 220, in order to expose only the ohmic contact layer 230.

A method of manufacturing the via hole 240 and the first barrier pattern 260 will be described below. A preliminary via hole (not shown) is formed on a region corresponding to the third metal 153 by etching the image detection unit 200 through the hard mask 250 (that is patterned by each unit pixel on the image detection unit 200). The preliminary via hole may partially expose the first and second doping layers 210 and 220 above the third metal 153. Additionally, after forming of a first barrier layer (not shown) on the preliminary via hole, an etching process is performed to remove the first barrier layer at the bottom of the preliminary via hole while remaining the first barrier layer on the sidewalls of the preliminary via hole. Thus, the first barrier pattern 260 is formed at only the sidewalls of the preliminary via hole. Then, through the etching process using the hard mask 250 and the first barrier pattern 260 as a mask, the via hole 240 is formed, which penetrates the image detection unit 200 and the interlayer insulation layer 160 to expose the third metal 153.

Figure 6:
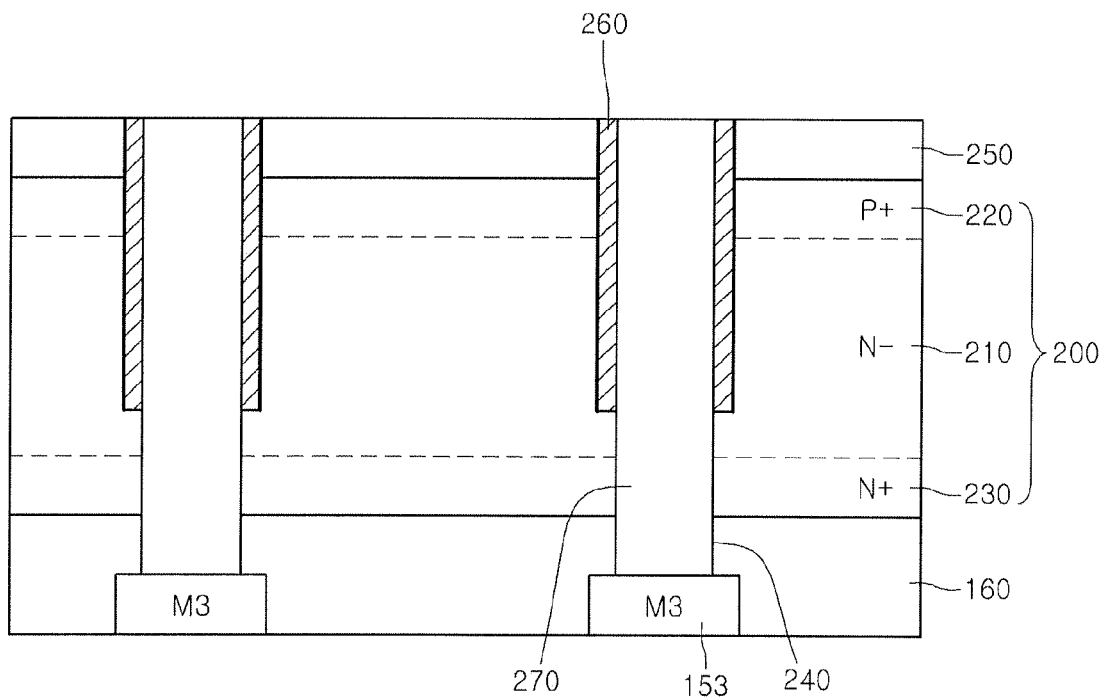

Referring to FIG. 6, a contact plug 270 is formed to electrically connect the image detection unit 200 with the readout circuit 120. For example, the contact plug 270 may be formed of metal materials such as Cu, Al, Ti, Ta, Ti/TiN, and W.

The contact plug 270 penetrates the image detection unit 200 and the interlayer insulation layer 260 through the via hole 240 such that it can be electrically connected to the third metal 153. Because the first barrier pattern 260 exists at the side of a portion of the contact plug 270, the contact plug 270 and the second doping layer 220 can be electrically separated from each other.

Accordingly, photo electrons generated in the image detection unit 200 can be transferred into the readout circuit 120 through the contact plug 270. Additionally, since the first barrier pattern 260 electrically separates the contact plug 270 from the second doping layer 220, the image detection unit 200 can operate normally.

Figure 7:
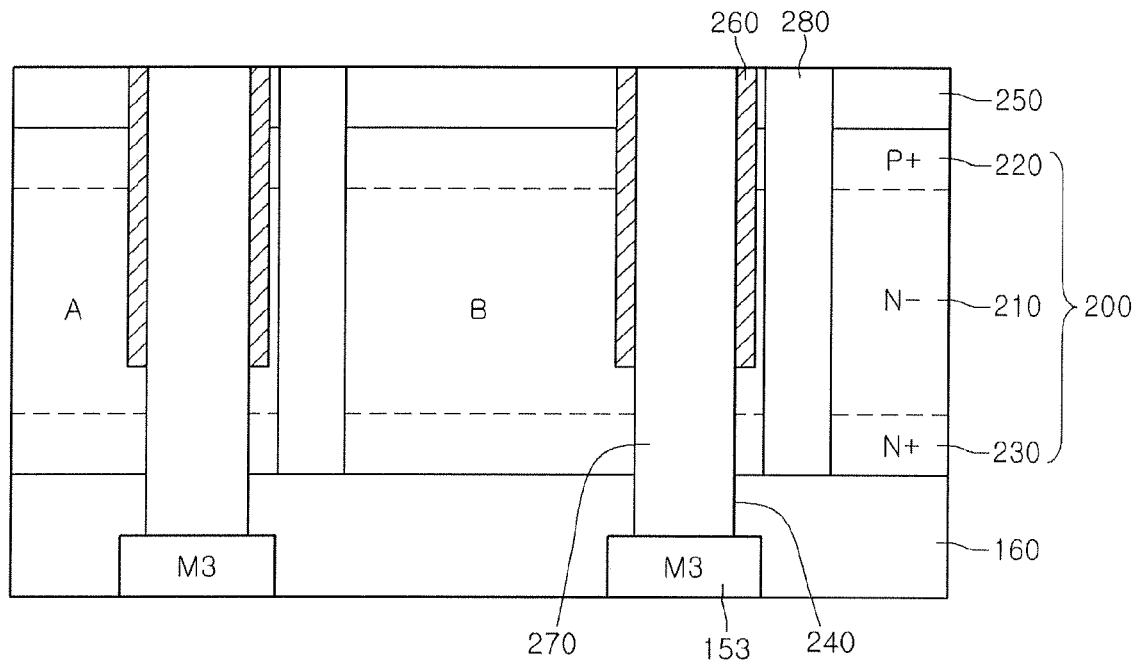

Referring to FIG. 7, a pixel separation unit 280 is formed to separate the image detection unit 200 by each pixel. The pixel separation unit 280 penetrates the hard mask 250 and the image detection unit 200 to pattern the image detection unit 200 by a pixel. Accordingly, the patterned image detection unit 200 is connected to the readout circuit 120. For example, the image detection unit 200 may be divided into a pixel A and a pixel B by the pixel separation unit 280 (see FIG. 12).

Additionally, the pixel separation unit 280 can be formed with the minimum space distance with respect to the contact plug 270. The pixel separation unit 280 may be designed to be formed at a position corresponding to the device separation unit 110 (see FIGS. 1 and 3) of the semiconductor substrate 100. That is, while the pixel separation unit 280 for pixel formation of the image detection unit 200 is designed, the contact plug 270 may be designed to be positioned at an edge region of the pixel separation unit 280. Accordingly, if the image detection unit 200 is defined with the unit pixel A and the unit pixel B by the pixel separation unit 280, the contact plug 270 is formed at an edge region of the unit pixel.

Moreover, in certain embodiments, the pixel separation unit 280 may be formed before the contact plug 270 is formed in the image detection unit 200.

Figure 8:
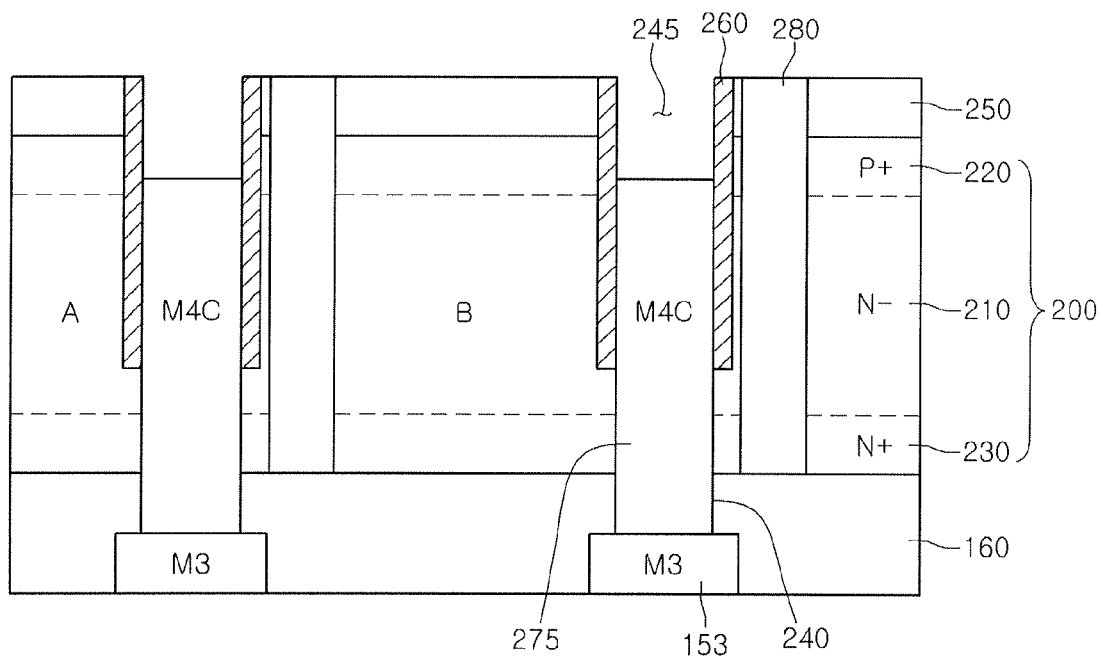

Referring to FIG. 8, a recess unit 245 and the fourth metal contact M4C 275 are formed by removing an upper region of the contact plug 270. The recess unit 245 may expose the first barrier pattern 260 corresponding to the second doping layer 220 by selectively etching the contact plug 270 corresponding to the second doping layer 220. For example, the recess unit 245 may be formed to expose the first barrier pattern 260 contacts the second doping layer 220 by controlling a recess process for the contact plug 270. Accordingly, the fourth metal contact 275 may be formed below the recess unit 245 by selectively removing the contact plug 270.

Figure 9:
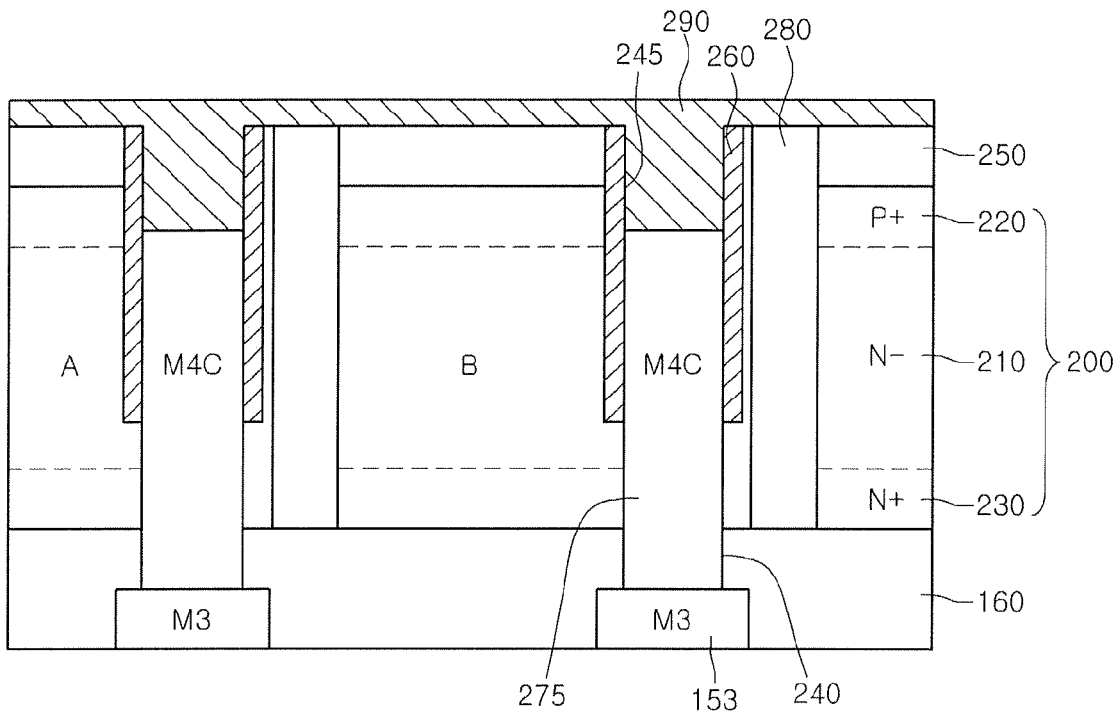

Referring to FIG. 9, a second barrier layer 290 is formed on the image detection unit 200 including the recess unit 245. The second barrier layer 290 is formed on the entire image detection unit 200 so as not to expose the recess unit 245 and the hard mask 250, and then a planarization process is performed on the second barrier layer 290. Since the second barrier layer 290 is formed by gap-filling the inside of the recess unit 245, the upper portion of the fourth metal contact 275 is covered with the second barrier layer 290.

In an embodiment, the second barrier layer 290 may be formed of an oxide layer or a nitride layer.

Figure 10:
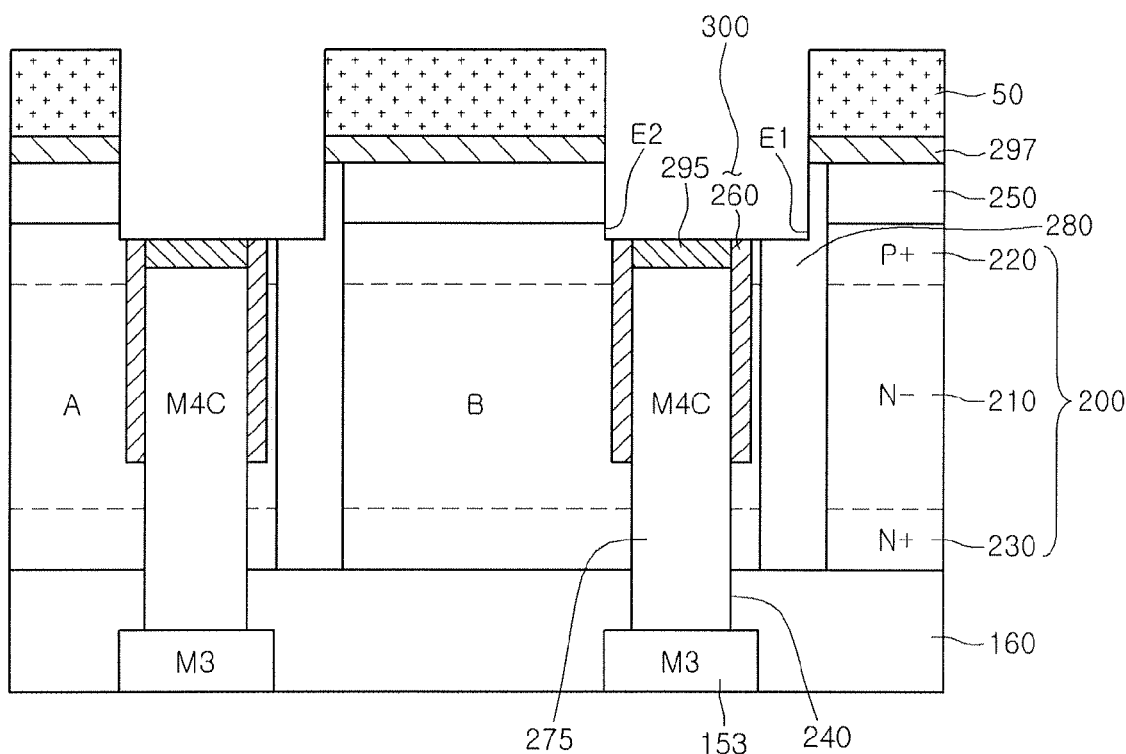

Referring to FIG. 10, a trench 300 is formed on the fourth metal contact 275 and the pixel separation unit 280 to selectively expose the second doping layer 220, resulting in formation of a second barrier pattern 295 between the trench 300 and the fourth metal contact 275.

In order to form the trench 300, a photoresist pattern 50 can be formed on the second barrier layer 290 to expose the second barrier layer 290 at a region corresponding to the fourth metal contact 275 and the pixel separation unit 280. An opening of the photoresist pattern 50 may have a broader width than the fourth metal contact 275 and the pixel separation unit 280. For example, the opening of the photoresist pattern 50 can overlap the fourth metal contact 275 and a portion of the pixel separation unit 280. The trench 300 is formed by etching the second barrier layer 290, the hard mask 250, the pixel separation unit 280, the first barrier pattern 260, and the second doping layer 220 using the photoresist pattern 50 as an etching mask. At this point, when the second doping layer 220 is partially exposed by controlling an etching condition such as an etching time, the etching process can be stopped.

As shown in FIG. 10, a first edge region E1 of the trench 300 exposes the inner surface of the pixel separation unit 280 at the one side of the fourth metal contact 275, and a second edge region E2 may expose a portion of the second doping layer 220 at the other side of the fourth metal contact 275. Additionally, when the second doping layer 220 is partially exposed by controlling an etching process to form the trench 300, the etching process can be stopped. The second barrier pattern 295 is formed at the bottom of the trench 300 from the second barrier layer 290 remaining below the trench 300.

Accordingly, since the second barrier pattern 295 remains in the recess unit 245 at the bottom of the trench 300, the fourth metal contact 275 is not exposed by the trench 300 due to the second barrier pattern 295.

In addition, when the photoresist pattern 50 is removed, a third barrier pattern 297 (the portion of the second barrier layer 290 covered by the photoresist pattern 50) is exposed.

Referring to FIG. 11, a fifth metal contact M5C 325 is formed in the trench 300. The fifth metal contact 325 may be electrically connected to the second doping layer 220 through the trench 300.

The fifth metal contact 325 may be formed by performing a planarization process after a metal layer is deposited on the image detection unit 200 including in the trench 300. For example, the planarization process may be a chemical mechanical polishing (CMP) process and a polishing completion point may be the third barrier pattern 297. Additionally, the fifth metal contact 325 may be formed of one of metal materials such as Cu, Al, Ti, Ta, Ti/TiN, and W.

The fifth metal contact 325 is formed in the trench 300 and is electrically connected to only the second doping layer 220 of the image detection unit 200. Therefore, the fifth metal contact 325 may serve as a ground contact of the image detection unit 200.

As mentioned above, the fourth metal contact 275 and the fifth metal contact 325 are electrically separated by the second barrier pattern 295. Additionally, since the fourth metal contact 275 is electrically connected to a portion of the first doping layer 210 or the ohmic contact layer 230 below the first barrier pattern 260, photo electrons generated in the image detection unit 200 may be transferred to the readout circuit 120 through the fourth metal contact 275.

Moreover, since the second barrier pattern 295 is interposed between the fourth metal contact 275 and the upper region of the pixel separation unit 280 in order to allow forming of the fifth metal contact 325, the image detection unit 200 secures a light receiving region to improve the fill factor. That is, since the fourth metal contact 275 and the fifth metal contact 325 are stacked on the same region, the light receiving region of the image detection unit 200 can be obtained to the maximum.

That is, as shown in FIG. 12, the image detection unit 200 is divided into a pixel A and a pixel B by the pixel separation unit 280 with a mesh type layout. The fifth metal contact 325 is formed at the edge region of the pixel separation unit 280, and the fourth metal contact 275 is formed on the bottom of the fifth metal contact 325. Therefore, a light receiving region of a unit pixel can be obtained to the maximum.

Additionally, the fifth metal contact line 320 for applying an electrical signal to the fifth metal contact 325 can be formed on the image detection unit 200 along the formation line of the pixel separation unit 280.

Figure 13:
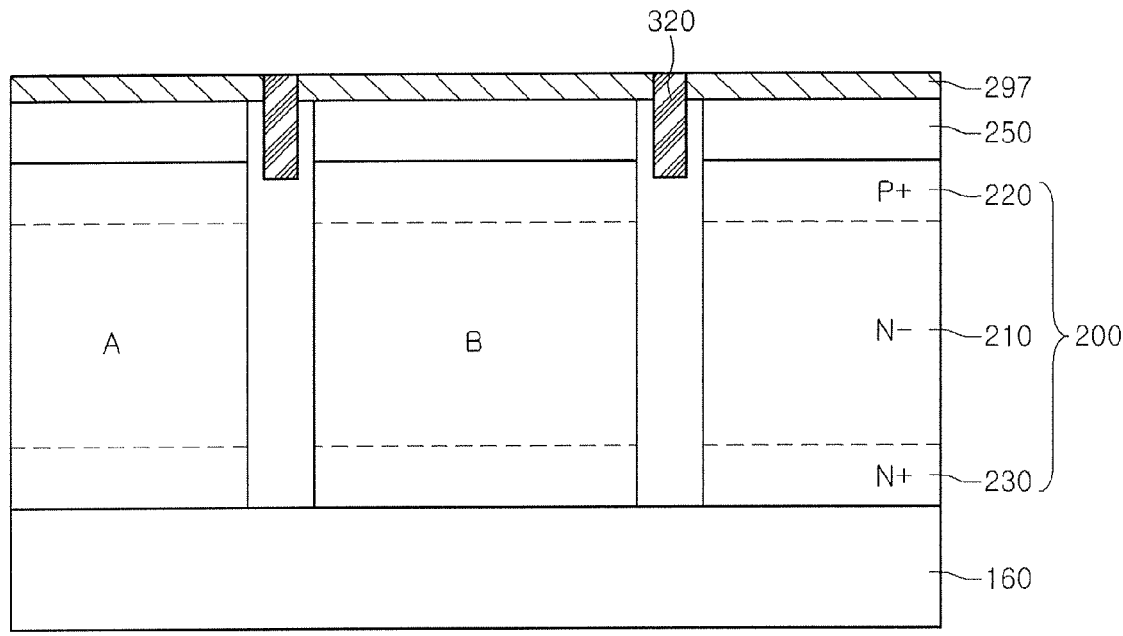

That is, when the trench 300 for forming the fifth metal contact 325 is formed, the pixel separation unit 280 may be patterned to form a via hole of a mesh type simultaneously. Accordingly, when the fifth metal contact 325 is formed in the trench 300, a metal layer is deposited in the via hole of the pixel separation unit 280, such that the fifth metal contact line 320 is formed as shown in FIG. 13.

The fifth metal contact 325 is formed in each pixel of the image detection unit 200 and the fifth metal line 320 for applying a ground voltage to the fifth metal contact 325 may be formed simultaneously when the fifth metal contact 325 is formed. Accordingly, since an additional metal line process for applying an electrical signal to the fifth metal contact 325 is omitted, processes can be simplified.

Additionally, the fifth metal contact line 320 is inserted in the pixel separation unit 280 along the formation line of the pixel separation unit 280. Therefore, device integration can be achieved.

Although not illustrated, a color filter and a micro-lens may be additionally formed on the image detection unit 200.

<Second Embodiment>

Figure 17:
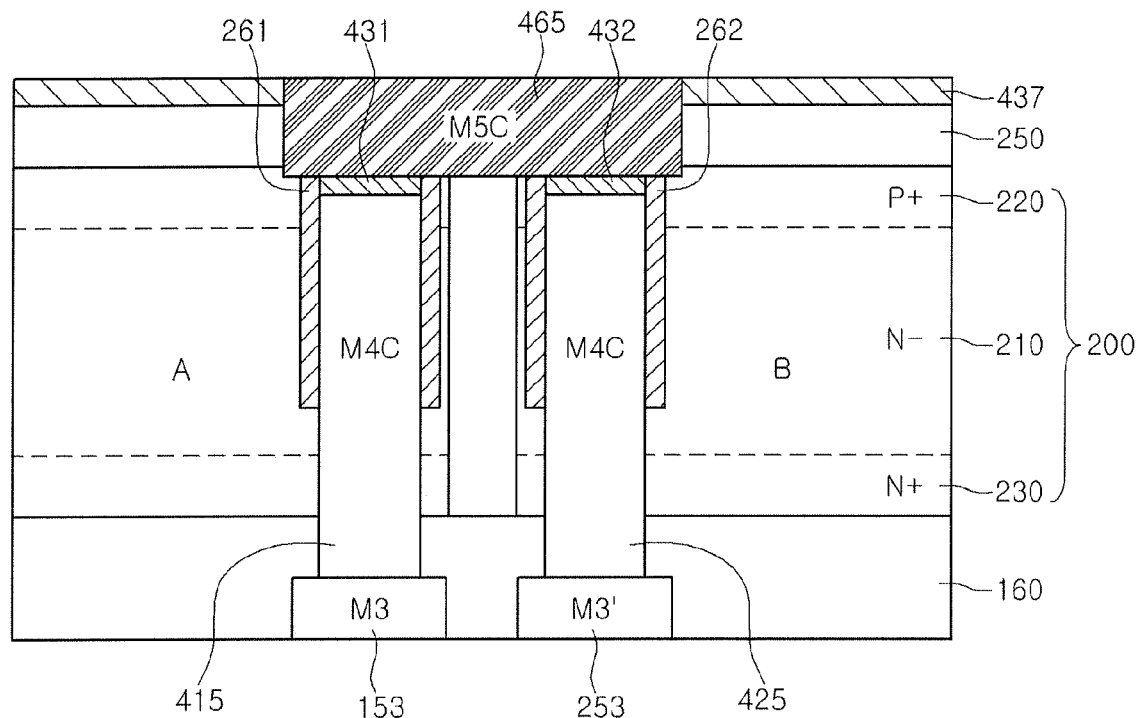
Figure 18:
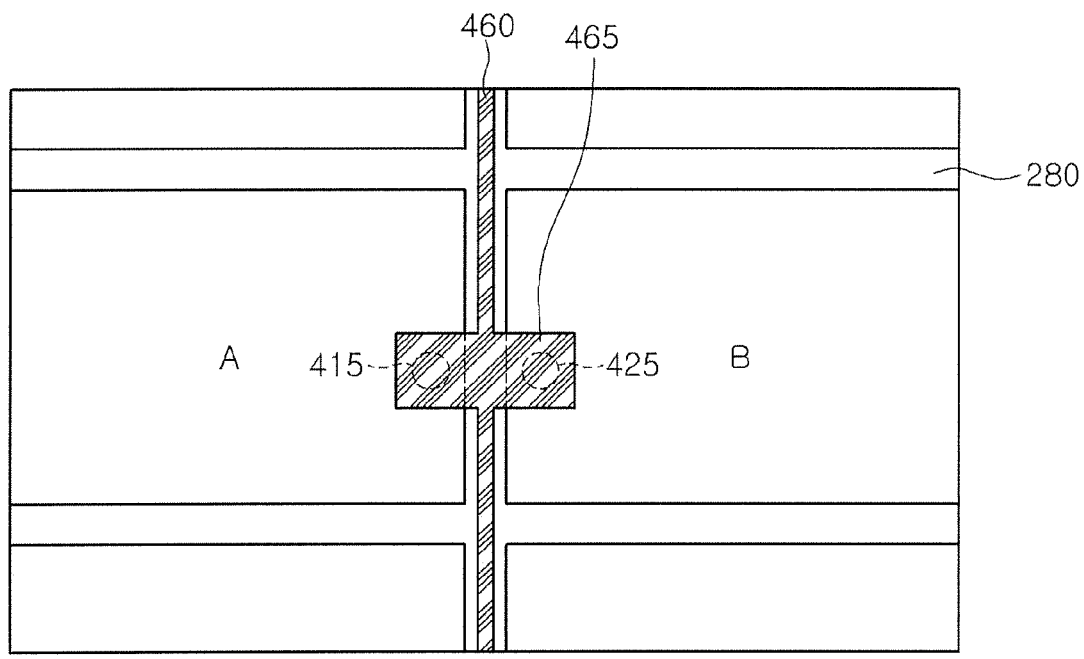

FIG. 17 is a cross-sectional view illustrating an image sensor according to a second embodiment of the present invention. FIG. 18 is a plan view of FIG. 17. The second embodiment may employ technical features of the first embodiment. Additionally, for convenience, the second embodiment uses like reference numbers with respect to like elements of the first embodiment.

The image sensor of the second embodiment can include an interlayer insulation layer 160 on a semiconductor substrate 100, an image detection unit 200, a pixel separation unit 280, fourth and fourth' metal contacts 415 and 425, first and first' barrier patterns 261 and 262, second and second' barrier patterns 431 and 432, and a fifth metal contact 465. The semiconductor substrate 100 includes a readout circuit 120 for each pixel. The interlayer insulation layer 160 includes a third metal 153 and a third' metal 253, which are mutually-adjacently formed on the semiconductor substrate 100 to be connected to respective readout circuits 120. The image detection unit 200 is formed on the interlayer insulation layer 160 and includes stacked first and second doping layers 210 and 220. The pixel separation unit 280 penetrates the image detection unit 200 and separates the image detection unit 200 by each pixel. The fourth and fourth' metal contacts 415 and 425 are formed at opposite sides of the pixel separation unit 280 and penetrate the image detection unit 200 and the interlayer insulation layer 160 to be connected to the third and third' metals 153 and 253, respectively. The first and first' barrier patterns 261 and 262 are formed at the upper sidewalls of the fourth and fourth' metal contacts 415 and 425 to cover the second doping layer 220 and expose the first doping layer 210. The second and second' barrier patterns 431 and 432 are formed on the fourth and fourth' metal contacts 415 and 425 in recess units. The recess units (see references 441 and 442 of FIG. 15) can be formed by removing portions of the fourth and fourth' metal contacts 415 and 425 to expose the first and first' barrier patterns 261 and 262 at regions corresponding to the second doping layer 220. The fifth metal contact 465 is formed in a trench and is electrically connected to the second doping layer 220 of the image detection unit 200 separated into at least two by the pixel separation unit 280. The trench (see reference 450 of FIG. 16) can be formed on the second barrier pattern 261, the pixel separation unit 280, and the second' barrier pattern 262 to selectively expose the second doping layer 220 of the image detection unit 200 at both sides of the pixel separation unit 280.

That is, the fifth metal contact 465 is formed in the second doping layer 220 of the pixel A and the pixel B on and at both sides of the pixel separation unit 280, and thus can serve as a common contact.

Hereinafter, referring to FIGS. 14 to 19, a manufacturing process of an image sensor is described according to the second embodiment.

While the second embodiment is described, the semiconductor substrate 100 including the readout circuit 120, the image detection unit 200, the contact plugs 410 and 420, the first barrier patterns 261 and 262, and the pixel separation unit 280 can be formed using the same method as the first embodiment, and thus their detailed description will be omitted.

Figure 19:
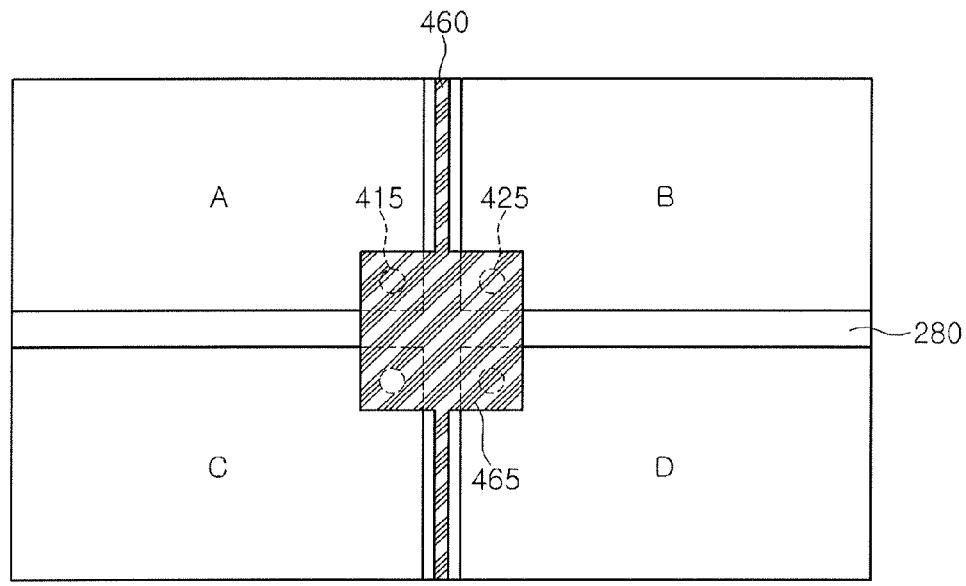

In relation to the features of the second embodiment, third metals 153 and 253 connected to respective ones of a plurality of readout circuits 120 are mutually adjacent. For example, two third metals corresponding to two pixels may be mutually adjacent, such as shown in FIG. 18. Additionally, four third metals corresponding to four pixels may be mutually adjacent, such as shown in FIG. 19. Therefore, according to the second embodiment, a metal line connected to the pixel A separated by the pixel separation unit 280 is referred to as the third metal 153 and a metal line connected to the pixel B is referred to as the third' metal 253.

Figure 14:
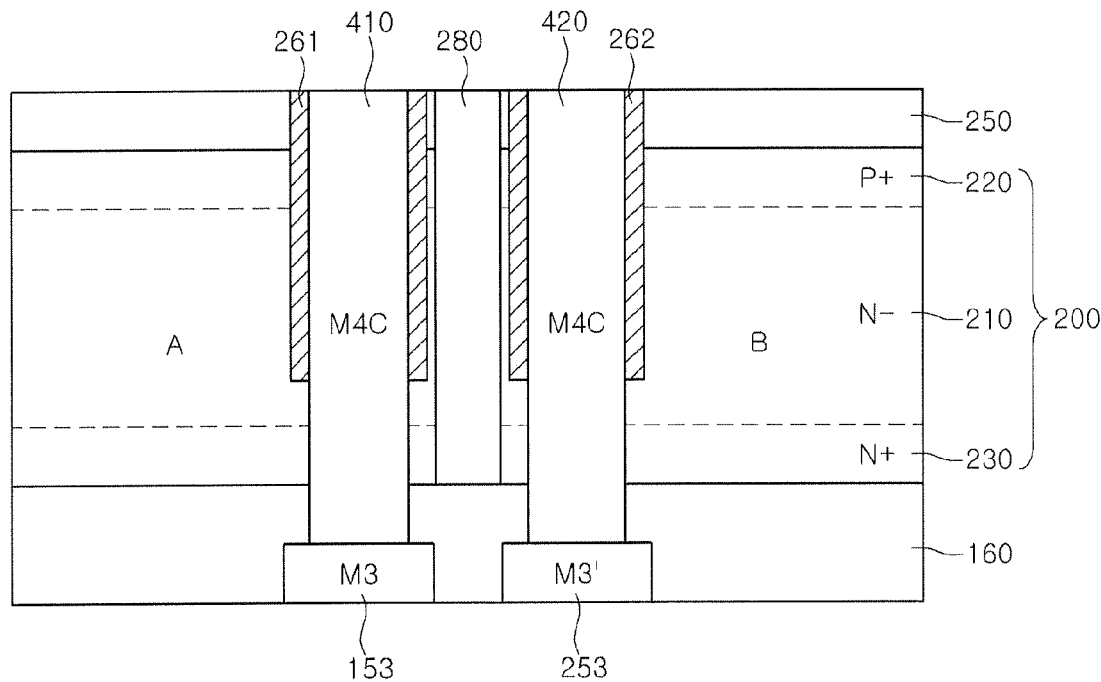
FIGS. 14 to 19 are views illustrating manufacturing processes of an image sensor according to a second embodiment.

Referring to FIG. 14, the image detection unit 200 is divided into the pixel A and the pixel B by the pixel separation unit 280. The contact plugs 410 and 420 connected to the third metal 153 and the third' metal 253 are respectively formed at both sides of the pixel separation unit 280.

The first barrier patterns 261 and 262 are selectively formed at sides of the contact plugs 410 and 420, respectively. The contact plugs 410 and 420 may electrically connect the first doping layer 230 of the image detection unit 200 with the third and third' metals 153 and 253. Additionally, the contact plugs 410 and 420 are electrically separated from the second doping layer 220 of the image detection unit 200 by the first and first' barrier patterns 261 and 262.

Since the pixel separation unit 280 has a mesh type layout, the contact plug 410 of the pixel A and the contact plug 420 of the pixel B may be formed at an edge region (sides) of the pixel separation unit 280. The contact plugs 410 and 420 can be formed at a central or corner region of the pixels A and B at the sides of the pixel separation unit 280.

Figure 15:
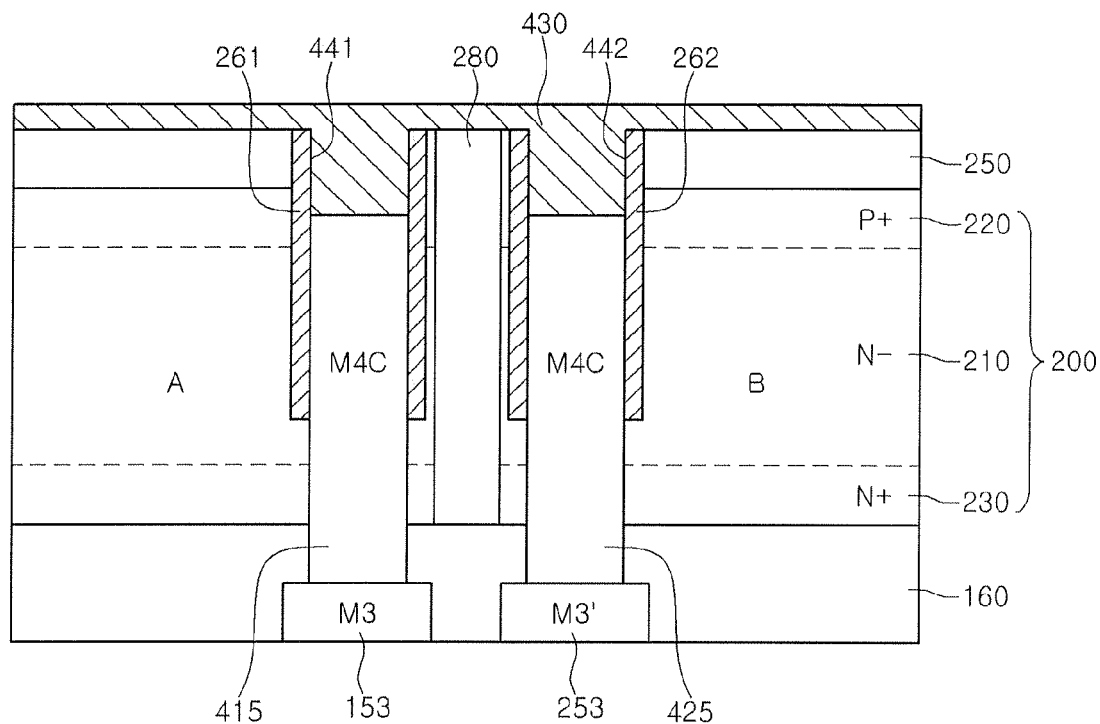

Referring to FIG. 15, a recess process is performed to selectively remove an upper region of the contact plugs 410 and 420 corresponding to the second doping layer 220, such that the fourth and fourth' metal contacts 415 and 425 are formed. The side of the first barrier pattern 260 corresponding to the second doping layer 220 is partially exposed by the recess units 441 and 442 on the fourth and fourth' metal contacts 415 and 425.

Next, a barrier layer 430 is formed on the image detection unit 200 including on the fourth and fourth' metal contacts 415 and 425. The barrier layer 430 may be formed to fill all the recess units 441 and 442 on the fourth and fourth' metal contacts 415 and 425.

Figure 16:
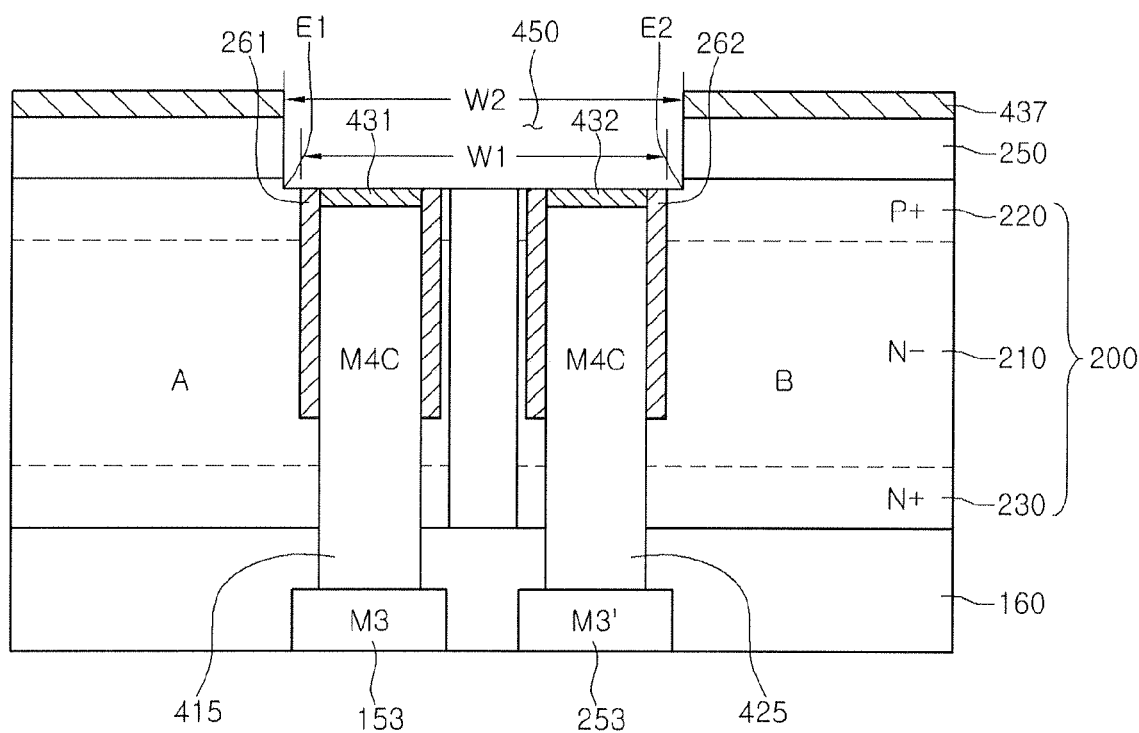

Referring to FIG. 16, a trench 450 is formed on the fourth metal contact 415, the pixel separation unit 280, and the fourth' metal contact 425 to selectively expose the second doping layer 220 at sides of the fourth and fourth' metal contacts 415 and 425.

For example, if the width of the fourth metal contact 415, the pixel separation unit 280, and the fourth' metal contact 425 is a first width W1, the trench 450 can be formed at a second width W2 that is wider than the first width W1.

Accordingly, the first edge region E1 of the trench 450 selectively exposes the second doping layer 220 of the pixel A and the second edge region E2 of the trench 450 selectively exposes the second doping layer 220 of the pixel B. Additionally, the barrier layer 430, the hard mask 250, the pixel separation unit 280, the first barrier pattern 260, and the second doping layer 220 are etched, and the second barrier patterns 431 and 432 are formed on the fourth and fourth' metal contacts 415 and 425 by controlling an etching condition when the trench 450 is formed. Therefore, the fourth and fourth' metal contacts 415 and 425 can be protected. A portion 437 of the barrier layer 430 can remain on the hard mask 250 after forming the trench 450.

Referring to FIG. 17, the fifth metal contact M5C 465 is formed in the trench 450. The fifth metal contact 465 may be a common metal contact of the fourth and fourth' metal contacts 415 and 425.

The trench 450 is formed on the upper region of the fourth metal contact 415, the pixel separation unit 280, and the fourth' metal contact 425. The first and second edge regions E1 and E2 of the trench expose the pixel A and pixel B, respectively. Accordingly, the fifth metal contact 465, which is gap-filled in the trench 450, becomes electrically connected to the second doping layer 220 of the pixel A and the pixel B. That is, the second doping layer 220 of the pixel A and the pixel B can share the fifth metal contact 465.

FIG. 18 is a plan view of FIG. 17.

Referring to FIG. 18, the image detection unit 200 is separated by each pixel because of the pixel separation unit 280 having a mesh type layout. The pixel A of the image detection unit 200 is adjacent to the pixel B with the pixel separation unit 280 therebetween. The fourth metal contact 415 of the pixel A and the fourth' metal contact 425 of the pixel B are adjacent with the pixel separation unit 280 therebetween. The fifth metal contact 465 is formed on the fourth metal contact 415, the pixel separation unit 280, and the fourth' metal contact 425. Since the fifth metal contact 465 is formed on the fourth and fourth' metal contacts 415 and 425 with the second barrier patterns 431 and 432 therebetween, it is electrically connected to only the second doping layer 220 of the pixel A and the pixel B and not the first doping layer 210 of the pixels.

The fifth metal contact 465 serves as a common contact of the pixel A and the pixel B, and thus can simultaneously apply a ground voltage to the second doping layer 220 of the pixel A and the pixel B. Additionally, the fifth metal contact 465 is formed at sides of the pixel separation unit 280, such that the fill factor can be improved by obtaining the light receiving region of the image detection unit 200.

Additionally, as shown in FIG. 18, the fifth metal contact line 460 for applying an electrical signal to the fifth metal contact 465 is formed along the formation line of the pixel separation unit 280 between the pixel A and the pixel B, such that device integration can be improved. That is, the fifth metal contact line 460 is formed in the pixel separation unit 280 corresponding to a space between the column corresponding to the pixel A and the column corresponding to the pixel B. The fifth metal contact line 460 can be formed at the same time when the fifth metal contact 465 is formed. Therefore, an additional metal line process for applying an electrical signal to the fifth metal contact 465 is omitted such that processes can be simplified.

As shown in FIG. 19, the fifth metal contact 465 may be formed on an edge region adjacent to four pixels. For example, the fifth metal contact 465 is formed on an edge region where the pixel A, the pixel B, the pixel C, and the pixel D (which are separated by the pixel separation unit 280) are mutually adjacent. Therefore, a ground voltage can be applied to four pixels simultaneously.

<Third Embodiment>

Figure 20:
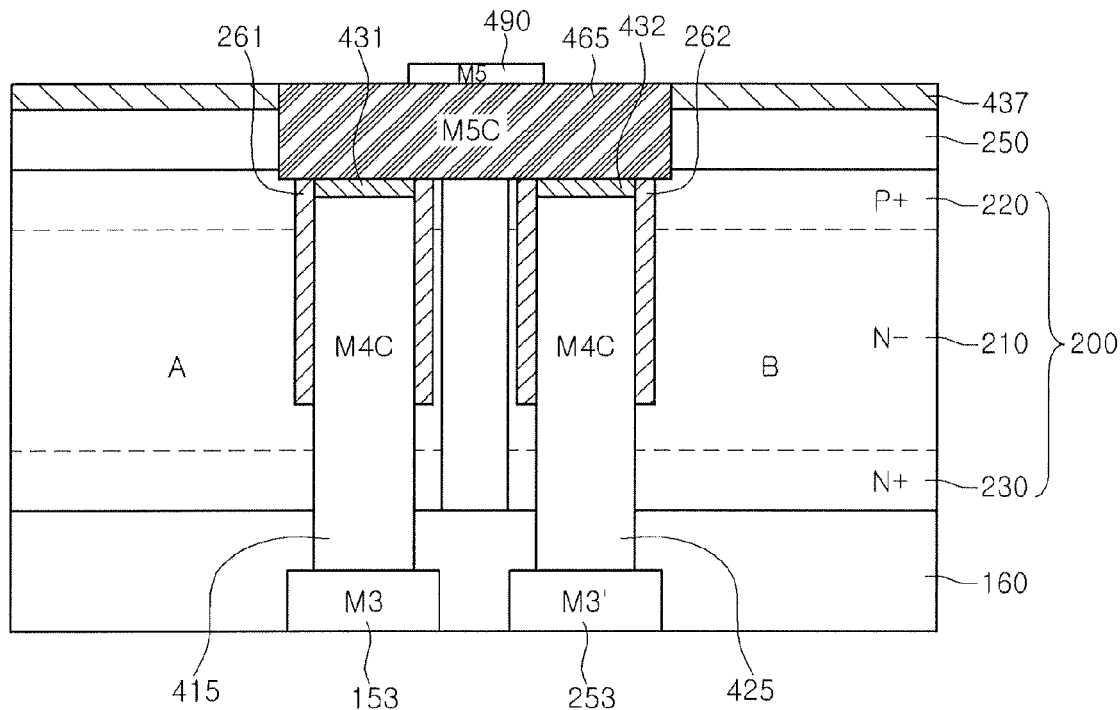
FIGS. 20 and 21 are views illustrating manufacturing processes of an image sensor according to a third embodiment.
Figure 21:
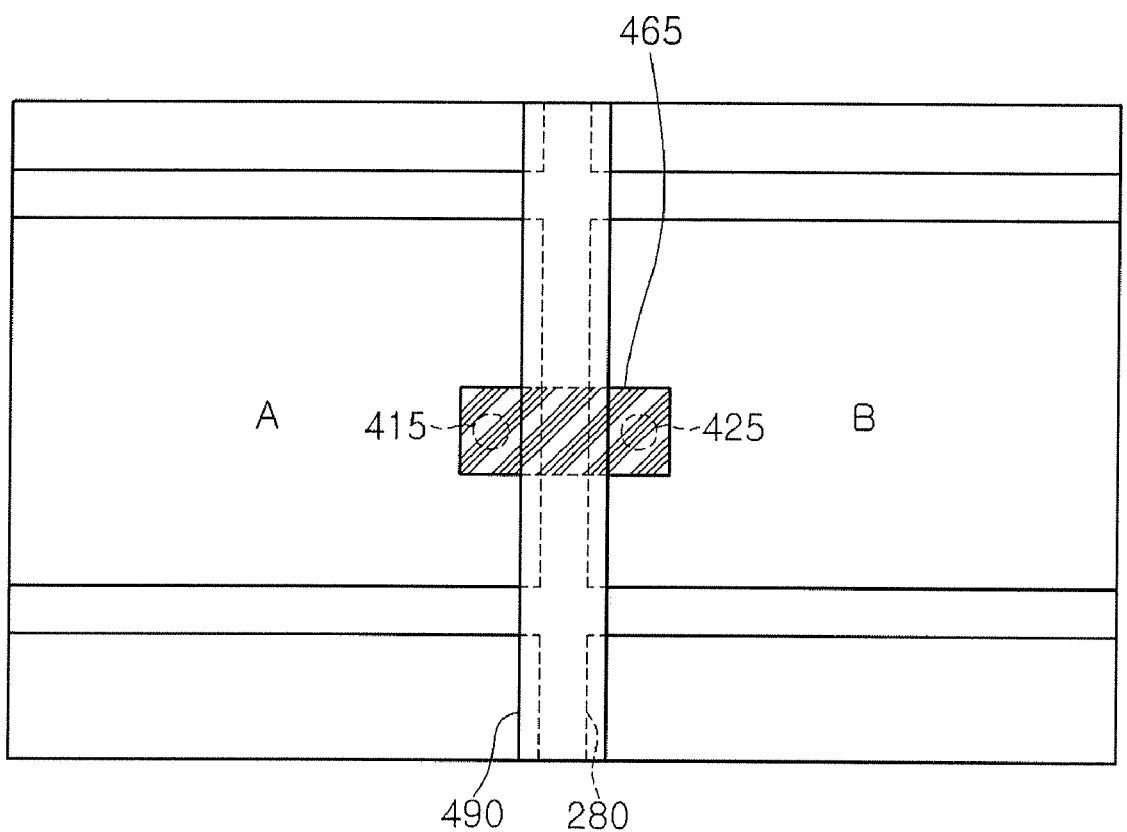

FIG. 20 is a cross-sectional view illustrating an image sensor according to a third embodiment. FIG. 21 is a plan view of FIG. 20. The third embodiment may adopt technical features of the second embodiment.

The image sensor of the second embodiment can include an interlayer insulation layer 160 on a semiconductor substrate 100, an image detection unit 200, a pixel separation unit 280, fourth and fourth' metal contacts 415 and 425, first and first' barrier patterns 261 and 262, second and second' barrier patterns 431 and 432, and a fifth metal contact 465. The semiconductor substrate 100 includes a readout circuit 120 for each pixel. The interlayer insulation layer 160 includes a third metal 150 and a third' metal 253, which are mutually-adjacently formed on the semiconductor substrate 100 to be connected to respective readout circuits 120. The image detection unit 200 is formed on the interlayer insulation layer 160 and includes stacked first and second doping layers 210 and 220. The pixel separation unit 280 penetrates the image detection unit 200 and separates the image detection unit 200 by each pixel. The fourth and fourth' metal contacts 415 and 425 are formed at both sides of the pixel separation unit 280 and penetrate the image detection unit 200 and the interlayer insulation layer 160 to be connected to the third and third' metals 153 and 253, respectively. The first and first' barrier patterns 261 and 262 are formed at the upper sidewalls of the fourth and fourth' metal contacts 415 and 425 to cover the second doping layer 220 and expose the first doping layer 210. The second and second' barrier patterns 431 and 432 are formed on the fourth and fourth' metal contacts 415 and 425 in recess units. The recess units (see references 441 and 442 of FIG. 15) can be formed by removing portions of the fourth and fourth' metal contacts 415 and 425 to expose the first and first' barrier patterns 261 and 262 at regions corresponding to the second doping layer 220. The fifth metal contact 465 is formed in a trench and is electrically connected to the second doping layer 220 of the image detection unit 200 separated into at least two by the pixel separation unit 280. The trench (see reference 450 of FIG. 16) can be formed on the second barrier pattern 261, the pixel separation unit 280, and the second' barrier pattern 262 to selectively expose the second doping layer 220 of the image detection unit 200 at both sides of the pixel separation unit 280.

Additionally, unlike the second embodiment, a fifth metal line 490 is formed on the fifth metal contact 465 of the image sensor according to the third embodiment.

As shown in FIGS. 20 and 21, the fifth metal contact 465 is formed on the adjacent pixel A and pixel B, and the fifth metal line 490 is formed on the fifth metal contact 465 such that it can apply a ground voltage to the pixel A and the pixel B.

The fifth metal line 490 is formed along the formation line of the pixel separation unit 280 between the pixel A and the pixel B, such that a light receiving region of the image detection unit 200 can be obtained to the maximum.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a semiconductor substrate including a readout circuit formed for each pixel;
    an interlayer insulation layer on the semiconductor substrate;
    a first metal line and a second metal line electrically connected to respective readout circuits on the semiconductor substrate, wherein the first metal line is disposed at a first pixel and the second metal line is disposed at a second pixel adjacent the first pixel, the first metal line and the second metal line being adjacent a boundary region between the first pixel and the second pixel;
    an image detection unit on the interlayer insulation layer and including stacked first and second doping layers;
    a pixel separation unit penetrating the image detection unit to separate the image detection unit according to each pixel;
    a first metal contact for the first pixel and a second metal contact for the second pixel penetrating the image detection unit and the interlayer insulation layer at sides of the pixel separation unit, the first metal contact and the second metal contact being electrically connected to the first and second metal lines, respectively;
    a first barrier pattern at an upper sidewall of each of the first and second metal contacts to spatially isolate the first and second metal contacts from the second doping layer while exposing the first and second metal contacts to the first doping layer;
    a second barrier pattern for the first pixel and a third barrier pattern for the second pixel on the first and second metal contacts, respectively; and
    a third metal contact formed in a trench above the first and second metal contacts to be electrically connected to the second doping layer of the image detection unit separated into at least the first pixel and the second pixel by the pixel separation unit, while being spatially isolated from the first and second metal contacts by the second and third barrier patterns,
    wherein the first metal contact and the first barrier pattern at the upper sidewall of the first metal contact are disposed in a via hole through the image detection unit.

2. The image sensor according to claim 1, wherein:
    the pixel separation unit is formed having a mesh type layout;
    the third metal contact serves as a common contact for the image detection units corresponding to the first pixel and the second pixel.

3. The image sensor according to claim 2, wherein:
    the third metal contact is formed on the image detection unit corresponding to adjacent four pixels including the first pixel and the second pixel, the four pixels being isolated with each other by the pixel separation unit; and
    the third metal contact serves as a common contact for the adjacent four pixels.

4. The image sensor according to claim 2, further comprising a third metal contact line electrically connected to the third metal contact, the third metal contact line being formed in the pixel separation unit corresponding to a space between the two pixels.

5. The image sensor according to claim 2, further comprising a fifth metal line formed on the third metal contact.

6. A method of manufacturing an image sensor according to claim 1, the method comprising:
    forming the readout circuit for each pixel on the semiconductor substrate;
    forming the interlayer insulation layer on the semiconductor substrate, the interlayer insulation layer including the first and second metal lines electrically connected to respective readout circuits;
    forming the image detection unit on the interlayer insulation, the image detection unit including the stacked first and second doping layers;
    forming the pixel separation unit that penetrates the image detection unit to separate the image detection unit by each pixel;
    forming first and second via holes penetrating the image detection unit and the interlayer insulation layer at opposite sides of the pixel separation unit, the first and second via holes exposing the first and second metal lines, respectively;
    forming the first barrier pattern at sidewalls of the first and second via holes to cover the second doping layer and expose the first doping layer;
    forming the first and second metal contacts in the first and second via holes, the first and second metal contacts being electrically connected to the first and second metal lines, respectively;
    forming the second and third barrier patterns respectively on the first and second metal contacts in the first and second via holes;
    forming the trench on the second barrier pattern, the pixel separation unit, and the third barrier pattern to selectively expose the second doping layer of the image detection unit at both sides of the pixel separation unit; and
    forming the third metal contact in the trench to be electrically connected to the second doping layer of the image detection units that are separated into at least two by the pixel separation unit.

7. The method according to claim 6, wherein the forming of the second and third barrier patterns and the forming of the trench comprises:

forming a barrier layer on the image detection unit including on the first and second metal contacts;

forming a photoresist pattern on the barrier layer, exposing a region above the first metal contact, the pixel separation unit, and the second metal contact;

performing an etching process to etch the barrier layer, the first barrier pattern, the pixel separation unit, and the second doping layer using the photoresist pattern as a mask to form the trench, wherein the trench exposes a portion of the second doping layer at both sides of the pixel separation unit; and stopping the etching process when a portion of the second doping layer is exposed during the forming of the trench to form the second and third barrier patterns from remaining portions of the barrier layer.

8. The method according to claim 6, wherein the pixel separation unit is formed having a mesh type layout, the method further comprising:

forming a third metal contact line in the pixel separation unit corresponding to a space between the two pixels, wherein the third metal contact line is electrically connected to the third metal contact.

9. The method according to claim 7, further comprising forming a fifth metal line on the third metal contact.

* * * * *